US011685995B2

United States Patent
Ahlf et al.

(10) Patent No.: US 11,685,995 B2
(45) Date of Patent: Jun. 27, 2023

(54) PROCESS FOR PRODUCING FLEXIBLE ORGANIC-INORGANIC LAMINATES

(71) Applicant: BASF Coatings GmbH, Muenster (DE)

(72) Inventors: Maraike Ahlf, Schriesheim (DE); Felix Eickemeyer, Heidelberg (DE); Daniel Loeffler, Birkenheide (DE); Stephan Klotz, Dornach (CH); Juergen Frank, Ludwigshafen (DE); Myung Mo Sung, Seoul (KR); Kwan Hyuck Yoon, Seoul (KR)

(73) Assignee: BASF COATINGS GMBH, Muenster (DE)

( * ) Notice: Subject to any disclaimer, the term of this patent is extended or adjusted under 35 U.S.C. 154(b) by 319 days.

(21) Appl. No.: 15/316,661

(22) PCT Filed: May 7, 2015

(86) PCT No.: PCT/EP2015/060105
§ 371 (c)(1),
(2) Date: Dec. 6, 2016

(87) PCT Pub. No.: WO2015/188992
PCT Pub. Date: Dec. 17, 2015

(65) Prior Publication Data
US 2018/0187306 A1    Jul. 5, 2018

(30) Foreign Application Priority Data

Jun. 12, 2014 (EP) .................................. 14172146
Jan. 7, 2015 (EP) .................................. 15150318

(51) Int. Cl.
*C23C 16/00* (2006.01)
*C23C 16/455* (2006.01)
(Continued)

(52) U.S. Cl.
CPC .......... *C23C 16/45529* (2013.01); *B05D 1/60* (2013.01); *C23C 16/0227* (2013.01); *C23C 16/403* (2013.01); *C23C 28/00* (2013.01)

(58) Field of Classification Search
None
See application file for complete search history.

(56) References Cited

U.S. PATENT DOCUMENTS 4,005,151 A    1/1977  Wataya et al.
7,074,501 B2 *  7/2006  Czeremuszkin ......... C08J 7/045
                                                 313/504
(Continued)

FOREIGN PATENT DOCUMENTS

CN    101078110 A    11/2007
CN    101660139 A    3/2010
(Continued)

OTHER PUBLICATIONS

Wohlfart et al., "MOCVD of Aluminum Oxide/Hydroxide onto Organic Self-Assembled Monolayers", 1999, Chemical Vapor Deposition, vol. 5, pp. 165-170.*
(Continued)

*Primary Examiner* — Seth Dumbris
(74) *Attorney, Agent, or Firm* — Armstrong Teasdale LLP (57) ABSTRACT

The present invention is in the field of processes for producing flexible organic-inorganic laminates as well as barrier films comprising flexible organic-inorganic laminates by atomic layer deposition. In particular the present invention relates to a process for producing a laminate comprising more than once the sequence comprising: (a) depositing an inorganic layer by performing 4 to 150 cycles of an atomic layer deposition process, and (b) depositing an organic layer comprising sulfur by a molecular layer deposition process.

20 Claims, 4 Drawing Sheets

(51) Int. Cl.
*C23C 16/40* (2006.01)
*C23C 28/00* (2006.01)
*B05D 1/00* (2006.01)
*C23C 16/02* (2006.01)

(56) References Cited

U.S. PATENT DOCUMENTS

| | | |
|---|---|---|
| 2010/0178481 A1 | 7/2010 | George et al. |
| 2012/0207944 A1 | 8/2012 | Finch et al. |
| 2012/0213945 A1 | 8/2012 | Lee |
| 2016/0215394 A1* | 7/2016 | Sung ............... G02F 1/1333 |
| 2018/0010249 A1* | 1/2018 | Ahlf ................. C23C 16/45529 |

FOREIGN PATENT DOCUMENTS

| | | |
|---|---|---|
| CN | 102593371 A | 7/2012 |
| DE | 2509407 A1 | 9/1975 |
| JP | 2006321127 * 11/2006 | ............... B32B 9/00 |
| KR | 1020140045716 A | 4/2014 |
| WO | WO 2009/002892 A1 | 12/2008 |
| WO | WO 2015/030298 A1 | 3/2015 |

OTHER PUBLICATIONS

International Search Report dated Aug. 10, 2015 in PCT/EP2015/060105.
Steven M. George, et al., "Atomic Layer Deposition: An Overview", Chemical Reviews, vol. 110, 2010, pp. 111-131.
Yun-hui Li, et al., "Molecular Layer Deposition of Thiol-Ene Multilayers on Semiconductor Surfaces", Langmuir, vol. 26, No. 2, XP055142293, 2010, pp. 1232-1238.
R. Paetzold, et al., "Permeation rate measurements by electrical analysis of calcium corrosion", Review of Scientific Instruments, vol. 74, No. 12, 2003, pp. 5147-5150.

* cited by examiner

PROCESS FOR PRODUCING FLEXIBLE ORGANIC-INORGANIC LAMINATES

The present invention is in the field of processes for producing flexible organic-inorganic laminates as well as barrier films comprising flexible organic-inorganic laminates by atomic layer deposition.

Electronic devices need efficient encapsulation and passivation due to their high sensitivity to moisture and oxygen. Typically, inorganic materials such as oxides, nitrides, carbides or glass are used as barrier material as they shows excellent moisture and oxygen barrier properties. However, inorganic materials strongly limit the form factor of electronic devices due to their rigidity. Furthermore, the fragility of e.g. large glass sheets makes production processes difficult and expensive. Electronic devices containing materials such as glass are prone to breakage upon mechanical stress.

WO 2009/002 892 A1 discloses coatings having inorganic layers and flexibilizing polymeric layers. However, the barrier properties are still insufficient for some applications.

US 2010/0 178 481 A1 discloses a barrier film consisting of two inorganic layers with either a silica layer, an organic polymer layer, or a hybrid organic-inorganic polymer layer in between. However, the barrier properties after bending are insufficient for some applications.

It was an objective of the present invention to provide a process for producing films with high water and oxygen barrier properties. At the same time it was aimed at providing a process for producing films which retain their barrier properties under high mechanical stress. A further objective was to provide a process for producing films with high stability against degradation in a humid atmosphere at elevated temperatures.

The objectives were achieved by a process for producing an laminate comprising more than once the sequence comprising (a) depositing an inorganic layer by performing 4 to 150 cycles of an atomic layer deposition process, and (b) depositing an organic layer comprising sulfur by a molecular layer deposition process.

The present invention further relates to a laminate comprising more than once the sequence comprising (a) an inorganic layer having a thickness of 0.4 to 15 nm and (b) a sulfur-comprising organic layer.

The present invention further relates to a barrier film comprising the laminate according to the present invention.

The present invention further relates to the use of the barrier film according to the present invention for encapsulation, packaging, or passivation.

The present invention further relates to an electronic device comprising the barrier film according to the present invention.

Preferred embodiments of the present invention can be found in the description and the claims. Combinations of different embodiments fall within the scope of the current invention.

A laminate in the context of the present invention is a product in which at least two layers of a different chemical composition are in close contact to each other. Unless indicated otherwise, there is generally no particular restriction to the size, the composition of each layer, or the strength with which the layers are held together.

Inorganic in the context of the present invention refers to materials which contain at least 1 wt.-% of at least one metal or semimetal, preferably at least 2 wt.-%, more preferably at least 5 wt.-%, in particular at least 10 wt.-%. Organic in the context of the present invention refers to materials which contain more than 99 wt.-% of nonmetals, preferably more than 99.5 wt.-%, in particular completely or essentially completely. It is even more preferable that the nonmetals are C, H, O, N, S, Se and/or P.

Atomic layer deposition (ALD) is a technique in which a series of self-limiting surface reactions are conducted which builds up conformal coatings of precise thickness depending on the number of self-limiting reactions performed. Typically the surface reaction takes place upon adsorption of a precursor from the gaseous state to the substrate. When all surface sites of the substrate are occupied, no further precursor adsorbs to the substrate making the reaction self-limiting. After removal of excess precursor the deposited layer is treated either chemically or physically which allows the subsequent deposition of further precursor. A sequence comprising such deposition and treatment is usually referred to as a cycle in the ALD process. The ALD process is described in detail by George (Chemical Reviews 110 (2010), 111-131). If organic molecules are deposited in an ALD process, such a process is often referred to as molecular layer deposition process (MLD).

The process according to the present invention comprises depositing an inorganic layer by performing 4 to 150 cycles of an atomic layer deposition process. Preferably the process comprises at least 5 cycles, more preferably at least 6 cycles. Preferably the process comprises not more than 50 cycles, more preferably not more than 40 cycles, even more preferably not more than 30 cycles, in particular not more than 20 cycles.

A cycle in an ALD process to form an inorganic layer typically comprises bringing a metal- or semimetal-containing compound or mixtures thereof into the gaseous state and depositing it from the gaseous state onto a substrate. In the following the term "metal or semimetal or mixtures thereof" is abbreviated by "(semi)metal". Bringing the (semi)metal-containing compound to the gaseous state can be achieved by heating it to elevated temperatures. In any case a temperature below the decomposition temperature of the (semi) metal-containing compound has to be chosen. Preferably, the heating temperature ranges from slightly above room temperature to 300° C., more preferably from 30° C. to 250° C., even more preferably from 40° C. to 200° C., in particular from 50° C. to 150° C. Alternatively, an inert gas such as nitrogen or argon can be purged through the (semi) metal-containing compound. In this way the inert gas is saturated with (semi)metal-containing compound in the gaseous state corresponding to the vapor pressure of the (semi) metal-containing compound.

Metals in the metal-containing compound are Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In Sn, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Bi. Semimetals in the semimetal-containing compound are B, Si, As, Ge, Sb. Preferred (semi)metals are B, Al, Si, Ti, Zn, Y, Zr, La, in particular Al.

Any (semi)metal-containing compound which can be brought into the gaseous state is suitable. Preferably, the (semi)metal-containing compound is a (semi)metal organic compound. These compounds include alkyl (semi)metals such as dimethyl zinc, trimethylaluminum or dibutyl tin; (semi)metal alkoxylates such as tetramethoxy silicon or tetra-isopropoxy zirconium; cyclopentadiene adducts like ferrocene or titanocene; (semi)metal carbenes such as tantalumpentaneopentylat or bisimidazolidinylenrutheniumchloride; (semi)metal halogenides such as germanium tetrabromide or titanium tetrachloride; carbon monoxide complexes like chromium hexacarbonyl or nickel tetracarbonyl. More preferably, the (semi)metal-containing compound is an alkyl (semi)metal, in particular a $C_1$ to $C_4$ alkyl (semi)metal.

It is possible to use more than one (semi)metal-containing compound. In this way it is possible to produce inorganic layers comprising for example mixed (semi)metal oxides such as tin-zinc oxide or barium-titanium oxides.

Preferably, a second (semi)metal-containing compound is present at 1 to 30 mol-% with respect to the total molar amount of (semi)metal-containing compound, more preferably at 2 to 15 mol-%. In this case, (semi)metal-doped inorganic layers are accessible, for example aluminum-doped zinc oxide, tin-doped indium oxide, or antimony-doped tin oxide. Alternatively, in order to obtain halogen-doped inorganic layers it is possible to use a halogen- and (semi)metal-containing compound or a halogen-containing compound in addition to the (semi)metal-containing compound preferably in an amount of 1 to 30 mol-% with respect to the total molar amount of (semi)metal-containing compound and halogen-containing compound, more preferably of 2 to 15 mol-%. Examples for such halogen-containing compounds are chlorine gas, ammonium fluoride or tin tetrachloride.

A cycle in an ALD process to form an inorganic layer typically further comprises the decomposition of the (semi)metal-containing compound after it is deposited onto a substrate. The decomposition can be effected in various ways. The temperature of the solid substrate can be increased above the decomposition temperature of the (semi)metal-containing compound. Furthermore, it is possible to expose the deposited (semi)metal-containing compound to oxygen, ozone, a plasma like oxygen plasma, ammonia, oxidants like nitrous oxide or hydrogen peroxide, reducing agents like hydrogen, alcohols, hydrazine or hydroxylamine, or solvents like water. It is preferable to use oxidants, plasma or water to obtain a layer of a (semi)metal oxide. Exposure to water, an oxygen plasma or ozone is preferred. Exposure to water is particularly preferred. If layers of elemental (semi)metal are desired it is preferable to use reducing agents. For layers of (semi)metal nitrides it is preferable to use ammonia or hydrazine.

A cycle in an ALD process to form an organic layer typically comprises bringing a sulfur-containing compound into the gaseous state and depositing it from the gaseous state onto a substrate. The sulfur in the sulfur-containing compound is preferably in the oxidation state −2, −1 or 0, which is minus two, minus one or zero, e.g. an organic thiol, an organic thioether, or an organic dithioether. An organic thiol is preferred. The sulfur-containing compound can contain one or more than one sulfur atoms. Preferably, the sulfur-containing compound contains one sulfur atom. More preferably, the sulfur-containing compound is an aromatic thiol. The thiol can be directly bond to the aromatic part of the molecule or via a linker such as a methylene group, preferably it is directly bond to the aromatic group. The sulfur-containing compound is even more preferably a thiophenol derivative. Preferably, the sulfur-containing molecule further contains one or more hydroxyl groups. Some preferred examples for sulfur-containing compounds are given below.

C-1

C-2

C-3

C-4

C-5

C-6

C-7

C-8

C-9

C-10

C-11

C-12

C-13

C-14

C-15

Particularly preferred are 4-mercaptophenol (C-1) and 4-mercapotbenzylic alcohol (C-2). It is also possible to make the organic layer with different organic molecules with the provision that at least one organic molecule is sulfur-containing.

Preferably, the sulfur-containing compound contains at least two sulfur atoms, more preferably two sulfur atoms. The sulfur atoms in the sulfur-containing compound are independent of each other parts of function groups as described above. Thiols are preferred, dithiols are more preferred. Preferably, two thiol groups are attached to an aromatic system, such as benzene, either directly or via a linker such as a methylene group. Some preferred examples for sulfur-containing compounds containing two sulfur atoms are given below.

C-16

Preferably, the organic layer is made by one ALD cycle comprising a sulfur-containing compound. However, it is also possible to run more than one ALD cycle to form the organic layer. Often it is necessary to include the deposition of a linker compound in an ALD cycle for making the organic layer. Examples include phosgene, thionyl chloride, diacid dichlorides such as oxalyl chloride or diisocyanates such as ethylenediisocyanate. It is also possible that an inorganic compound can form the linker such as alkyl (semi)metals, for example trimethylaluminum. In this case the organic layer also includes (semi)metals.

Typical pressures at which the ALD process is performed range from 1500 to $10^{-5}$ mbar, preferably from 100 to $10^{-3}$ mbar, more preferably from 10 to 0.1 mbar. It is therefore preferable to run the process in an apparatus in which the pressure can be adjusted such as in a vacuum chamber. The temperature for the ALD process is in the range of −20 to 500° C., preferably 0 to 300° C., in particular 50 to 200° C. Typically, the surface is exposed to the (semi)metal-containing compound or the sulfur-containing compound in one ALD cycle for 1 ms to 30 s, preferably 10 ms to 5 s, in particular 50 ms to 1 s. It is preferable to purge the substrate with an inert gas in between exposing the surface to the (semi)metal-containing compound or the sulfur-containing compound of different chemical structure, normally for 0.1 s to 10 min, preferably for 1 s to 3 min, in particular for 10 s to 1 min.

In the process according to the present invention the sequence of depositing an inorganic layer and depositing a sulfur-comprising organic layer is performed more than once, for example at least twice, preferably at least three times, more preferably at least five times, even more preferably at least 10 times, in particular at least 30 times, such as at least 100 times or at least 200 times. Preferably, this sequence is performed at most 1000 times. The organic and inorganic layers can independent of each other be made by the same number of ALD cycles or by different ones. For example, one inorganic layer can be made by 4 ALD cycles while a different one can be made by 8 ALD cycles. Preferably, all inorganic layers are made with the same number of ALD cycles. More preferably, all inorganic layers are made with the same number of ALD cycles and all organic layers are made by one ALD cycle.

Furthermore it is possible that different compounds are used for producing different inorganic layers or for different organic layers. Preferably, all organic layers are produced with the same organic compounds. Preferably, all inorganic layers are produced with the same (semi)metal-containing compound.

The process according to the present invention yields laminates with low permeability for small molecules like water and oxygen and with high flexibility. Therefore, the present invention also relates to laminates comprising an inorganic layer and a sulfur-comprising organic layer. A good measure for the permeability for small molecules is the water vapor transmission rate (WVTR). It is preferably measured by evaporating an array of calcium dots onto the laminates and depositing another laminate on top of the calcium dots. These samples are then exposed to warm humid air, for example at 30 to 100° C. at 30 to 90% relative humidity, preferably at 60 to 85° C. at 70 to 90% relative humidity, for example at 60° C. and 90% relative humidity or 85° C. and 85% relative humidity. This exposure usually takes at least 100 hours, preferably at least 200 hours, in particular at least 300 hours. Normally, the exposure does not take more than 1000 hours. The number of calcium dots which have turned transparent is used to calculate the WVTR as described by Paetzold et al. (Review of Scientific Instruments 74 (2003) 5147-5150). Generally, a laminate is regarded as having a low permeability for small molecules if the WVTR is smaller than $10^{-2}$ g/m²d, preferably $10^{-4}$ g/m²d, more preferably $10^{-5}$ g/m²d, in particular $10^{-6}$ g/m²d.

A suitable method of measuring the flexibility of the laminate is to bend the laminate containing calcium dots and a second laminate on top as described above several times, for example 100 times, around a cylindrically shaped object with a radius of 0.1 to 10 cm, preferably 0.1 to 2 cm and measure the WVTR rate afterwards as described above. The laminate is regarded as having high flexibility if the WVTR is not more than 1000 times higher in comparison to the respective laminate before bending, preferably not more than 100 times higher, in particular not more than 10 times higher.

According to the present invention the inorganic layer has a thickness 0.4 to 15 nm. Preferably the inorganic layer has a thickness of at least 0.5 nm, more preferably at least 0.6. Preferably the inorganic layer has a thickness of not more than 9 nm, more preferably not more than 5 nm, even more preferably not more than 4 nm, in particular not more than 3 nm, such as not more than 2 nm. The sulfur-comprising organic layer preferably has a thickness of 0.1 to 10 nm, more preferably of 0.2 to 5 nm, in particular 0.3 to 3 nm, such as 0.4 to 1 nm. The thickness of the layers is typically measured by X-ray diffraction such as wide-angle X-ray diffraction (WAXD), preferably with a synchrotron as X-ray source.

The inorganic layer can be chosen from a wide variety of compounds. These include inorganic oxides, inorganic nitrides, inorganic carbides, perovskites, garnets, pyrochlors, transparent conductors and II-VI compounds. Inorganic oxides are preferred.

Examples for inorganic oxides including earth alkaline metal oxides such as BeO, MgO, CaO, SrO, BaO; main group metal oxides such as $Al_2O_3$, $SiO_2$, $Ga_2O_3$, $GeO_2$, $In_2O_3$, $SnO_2$, $Tl_2O$, PbO, $PbO_2$, $Bi_2O_3$; transition metal oxides such as $Sc_2O_3$, $TiO_2$, $V_2O_5$, $CrO_2$, MnO, $Mn_2O_3$, FeO, $Fe_3O_4$, $Fe_2O_3$, CoO, $Co_2O_3$, NiO, $Ni_2O_3$, $Cu_2O$, CuO, ZnO, $Y_2O_3$, $ZrO_2$, $Nb_2O_5$, MoO, $MoO_2$, Tc, $RuO_2$, $Rh_2O$, PdO, $Ag_2O$, CdO, $HfO_2$, $Ta_2O_5$, $WO_3$, $ReO_3$, $OsO_4$, $IrO_2$, $PtO_2$, AuO, $Hg_2O$; lanthanoid oxides such as $La_2O_3$, $Ce_2O_3$, $CeO_2$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$. Preferred are $B_2O_3$, $Al_2O_3$, $SiO_2$, $La_2O_3$, $Y_2O_3$, ZnO, $ZrO_2$, in particular $Al_2O_3$. Often, oxides in thin layers according to the present invention are hydrated to some extent. These hydrates nevertheless count as oxides represented by a formula above in the context of the present invention. Alternatively, the oxide $Al_2O_3$, for example, can be represented by the more general formula $AlO_x(OH)_y$, wherein $0 \leq x \leq 1.5$; $0 \leq y \leq 3$ and $2 x+y=3$, preferably $1 \leq x \leq 1.5$; $0 \leq y \leq 1$ and $2 x+y=3$.

Examples for inorganic nitrides include BN, AlN, $Si_3N_4$, $Ti_3N_4$, TaN, NbN, WN, MoN, GaN, $Zr_3N_4$, InN, and $Hf_3N_4$, preferably BN, AlN, $Si_3N_4$, $Ti_3N_4$, $Zr_3N_4$. Examples for inorganic carbides include $B_4C_3$, SiC, ZrC. Examples for perovskites include $BaTiO_3$, $SrTiO_3$, $LaNiO_3$, and $LaCoO_3$. Examples for garnets include $Fe_3Al_2(SiO_4)_3$, $Mg_3Al_2(SiO_4)_3$, and $Mn_3Al_2(SiO_4)_3$. Examples for pyrochlores include $La_2Zr_2O_7$, $Gd_{1.9}Ca_{0.1}Ti_2O_{6.9}$, $Dy_2Ti_2O_7$, and $Y_2Mo_2O_7$. Examples for transparent conductors include Sn-doped $In_2O_3$, Sb-doped $SnO_2$, F-doped $SnO_2$, Al-doped ZnO. Examples for II-VI compounds are ZnS, ZnSe, ZnTe, CaS, SrS, BaS, CdS, CdTe, CdSe. Furthermore, mixed oxides and/or nitrides are possible such as AlON, SiAlON.

Preferably, the laminate comprises at least two inorganic layers with a sulfur-comprising organic layer in between. More preferably, the laminate comprises alternatingly at least 30 inorganic and at least 30 organic layers, even more preferably at least 100 inorganic and at least 100 organic layers, in particular at least 200 inorganic and at least 200 organic layers. Preferably, the laminate comprises not more than 1000 inorganic and not more than 1000 organic layers. Alternatingly means that each two inorganic layers are separated by an organic layer.

According to the present invention the laminat comprises more than once the sequence comprising
(a) an inorganic layer having a thickness of 0.4 to 15 nm and
(b) a sulfur-comprising organic layer
for example at least twice.

Preferably, the laminate comprises this sequence at least three times, more preferably at least five times, even more preferably at least 10 times, in particular at least 30 times, such as at least 100 times or at least 200 times.

Preferably the organic layer contains sulfur in the oxidation state −2, −1 or 0, more preferably in the oxidation state −2 or −1. It is possible that different sulfur atoms in the organic layer are of different oxidation states. In this case it is preferable if the average oxidation state of the sulfur is 0 to −2. The oxidation state of sulfur in a laminate according to the present invention can be determined by the characteristic bands in an infrared (IR) spectrum of the laminate.

The laminate according to the present invention is particularly useful for making barrier films. Therefore the present invention further relates to a barrier film comprising the laminate according to the present invention.

The barrier film according to the present invention typically further comprises a substrate. The substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Polymers are preferred. Polymers include polyesters such as polyethylene terephthalate (PET) or polyethylene naphthalene-dicarboxylic acid (PEN); polyimides; polyacrylates such as poly methyl methacrylate (PMMA); polyacrylamides; polycarbonates such as poly(bisphenol A carbonate); polyvinylalcohol and its derivatives like polyvinyl acetate or polyvinyl butyral; polyvinylchloride; polyolefins such as polyethylene (PE) or polypropylene (PP); polycycloolefins such as polynorbornene; polyethersulphone; polyamides like polycaprolactam or poly(hexamethylene adipic amide); cellulose derivatives such as hydroxyethyl cellulose, hydroxypropyl cellulose, methyl cellulose, methyl hydroxylpropyl cellulose or nitrocellulose; polyurethanes; epoxy resins; melamine formaldehyde resins; phenol formaldehyde resins. Polymers include copolymers such as poly(ethylene-co-norbornene) or poly(ethylene-co-vinylacetate). Polyesters and polycycloolefins are preferred.

The substrate can have any size and shape. Preferably the substrate is a film. The thickness of the substrate film depends on the application. If the barrier film is bent around a radius of more than 10 mm, the substrate film preferably has a thickness of 100 to 1000 μm, more preferably 100 to 500 μm, for example 100 to 200 μm. If the barrier film is bent with a radius of less than 10 mm the substrate film preferably has a thickness of 1 to 100 μm, more preferably 10 to 70 μm, such as 40 to 60 μm.

The surface of the substrate is preferably of high planarity. High planarity in the context of the present invention means that the highest point on the surface is not more than 100 nm higher than the lowest point on the surface, preferably not more than 50 nm. The planarity can be measured with atomic force microscopy, preferably in tapping mode.

Substrates are often not available with high planarity, e.g. due to small scratches, or particles such as dust adhered to their surface. It is therefore preferred that the barrier film further comprises a planarization layer to avoid damaging such as puncturing the laminate. More preferably the planarization layer is in between the substrate and the laminate. In this case the planarization layer can additionally serve to better hold together the substrate and the laminate, particularly upon bending or heating. Planarization layers can comprise organic polymers such as acrylates or epoxy, ceramics such as carbides, e.g. SiC, or organic-inorganic hybrid materials such as polyalkylsiloxanes. Organic polymers are preferred.

Often the planarization layer is made by depositing the material making up the planarization layer on the substrate before applying the laminate. In the case of organic polymers a liquid comprising a monomer is cast on the substrate and then cured, for example by heating or by UV initiation. UV initiation is preferred, more preferably the liquid comprising the monomer further comprises a curing aid such as a functionalized benzophenone. Preferably the liquid comprising the monomer comprises a mixture of mono- and difunctional monomers such that crosslinked organic polymers are obtained after curing. Planarization layers comprising ceramics are usually obtained by sputtering the material onto the substrate. Planarization layers comprising organic-inorganic hybrid materials can be obtained by casting a solution comprising an organic-inorganic precursor on the substrate, evaporating the solvent and condensing the organic-inorganic precursor, for example by heating. This process is often referred to as sol-gel process. An example for an organic-inorganic precursor is alkyl-trialkoxysilane. Preferably the precursor is functionalized with a UV curable side group, for example acrylate. In this way the organic-inorganic hybrid material can be cross-linked.

Preferably the material making up the planarization layer has a modulus of elasticity in between that of the substrate material and that of the laminate, for example 10 to 30 GPa. The method of determining the modulus of elasticity is described in ISO 527-1 (Plastics—Determination of tensile properties, 2012).

Preferably the barrier film according to the present invention further comprises a protective layer to avoid mechanical damaging of the laminate, e.g. by scratching. The protective layer can for example comprise an epoxy resin. It is further possible that the protective layer is an adhesive which e.g. connects the laminate to an electronic device.

Preferably the barrier film according to the present invention further comprises a getter material. This getter material binds small molecules like water or oxygen and thus decreases the permeability of the barrier film even further. Examples for getter materials are highly reactive metals such as Ca or strongly water-absorbing oxides such as CaO or $SiO_2$.

The present invention further relates to the use of the barrier film according to the present invention for encapsulation, packaging or passivation. Any good which is sensitive to small molecules like water or oxygen can be encapsulated, packed or passivated with the barrier films according to the present invention such as food, medicaments, reactive chemicals, batteries, or preferably electronic devices. Examples for electronic devices are field-effect transistors (FET), solar cells, light emitting diodes, sensors, or capacitors, in particular if the active materials in the electronic devices are organic molecules. The barrier film according to the invention can in addition be used as electric insulator, for example as dielectric in a transistor.

With the process according to the present invention laminates are accessible which have a high barrier against the diffusion of small molecules. These laminates maintain their high diffusion barrier upon bending. When using flexible substrates, flexible barrier films are accessible with high diffusion barriers.

EXAMPLES

Example 1 (Inventive)

A barrier film was made by using a PET substrate. The PET substrate had a size of 2.5×2.5 cm$^2$, a thickness of 100 µm, and a density of 1.4 g/cm$^3$. The PET substrate was cleaned by rinsing with deionized water, acetone and ethanol followed by a 30 min $O_2$ plasma treatment with a plasma power of 100 W. Afterwards the PET substrate was degassed within a vacuum chamber for 30 min until the pressure reached 5·10$^{-5}$ mbar. The vacuum chamber including the PET substrate was heated to 80° C. Trimethylaluminum (TMA) in the gaseous state was introduced into the vacuum chamber by opening a valve to a side chamber containing TMA in liquid form for 2 s, then the vacuum chamber was evacuated again to reach 5·10$^{-5}$ mbar for 15 s.

After this, water in the gaseous state was introduced into the vacuum chamber for 2 s after which the vacuum chamber was again evacuated for 38 s. This sequence was performed six times. Then TMA was introduced into the vacuum chamber as describe above for 2 s, the vacuum chamber was evacuated for 15 s whereupon 4-mercaptophenol (4MP) was introduced into the vacuum chamber by opening a valve to a chamber containing liquid 4MP at 85° C. for 8 s after which the vacuum chamber was evacuated for 200 to 300 s.

The above described sequence is denoted by [[TMA-$H_2O]_6$-TMA-4MP]. This sequence was consecutively performed 250 times.

Figure 1:
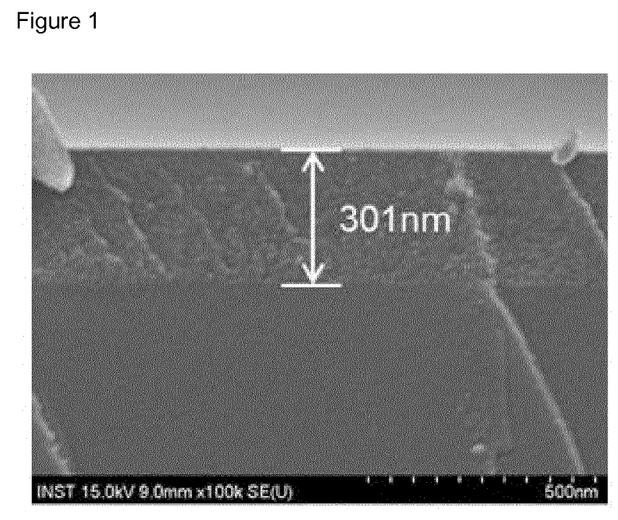

The same laminate was prepared on a silicon wafer. This wafer was fractured and subject to scanning electron microscopy. The thus obtained image is depicted in FIG. 1. The thickness of the laminate was estimated from the image to be 301 nm.

Example 2.1 (Inventive)

A barrier film was made as in example 1 wherein a sequence [[TMA-$H_2O]_8$-TMA-4MP] was consecutively performed 140 times.

Example 2.2 (Inventive)

A barrier film was made as in example 1 wherein a sequence [[TMA-$H_2O]_8$-TMA-4MP] was consecutively performed 220 times.

Figure 2:
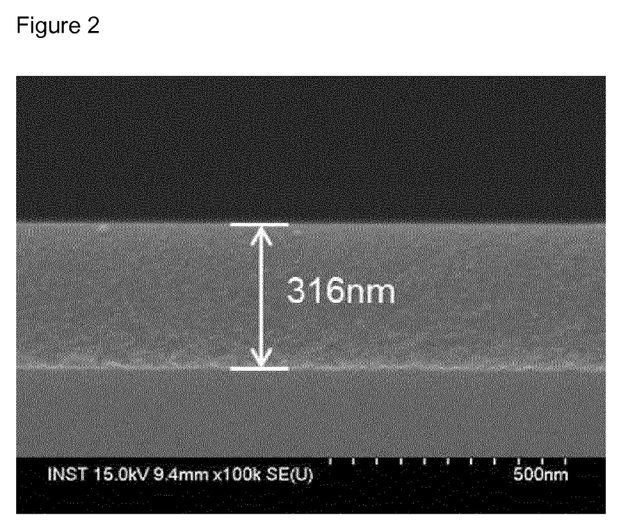

The same laminate was prepared on a silicon wafer. This wafer was fractured and subject to scanning electron microscopy. The thus obtained image is depicted in FIG. 2. The thickness of the laminate was estimated from the image to be 316 nm.

Example 2.3 (Inventive)

A barrier film was made as in example 1 wherein a sequence [[TMA-$H_2O]_8$-TMA-4MP] was consecutively performed 280 times.

Example 3 (Inventive)

A barrier film was made as in example 1 wherein a sequence [[TMA-$H_2O]_{13}$-TMA-4MP] was consecutively performed 150 times.

Figure 3:
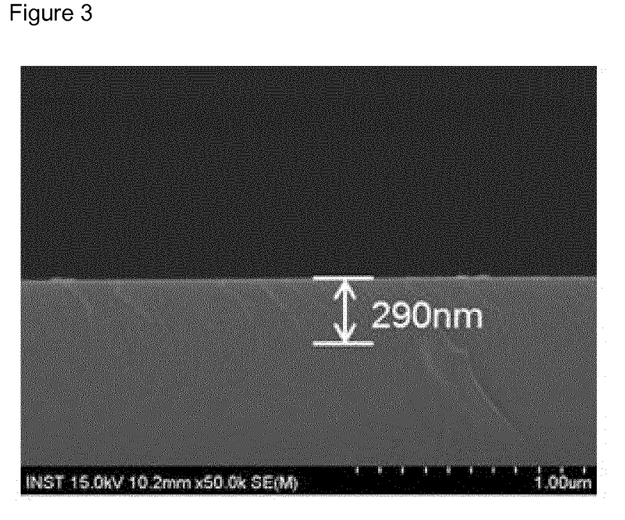

The same laminate was prepared on a silicon wafer. This wafer was fractured and subject to scanning electron microscopy. The thus obtained image is depicted in FIG. 3. The thickness of the laminate was estimated from the image to be 290 nm.

Figure 4A:
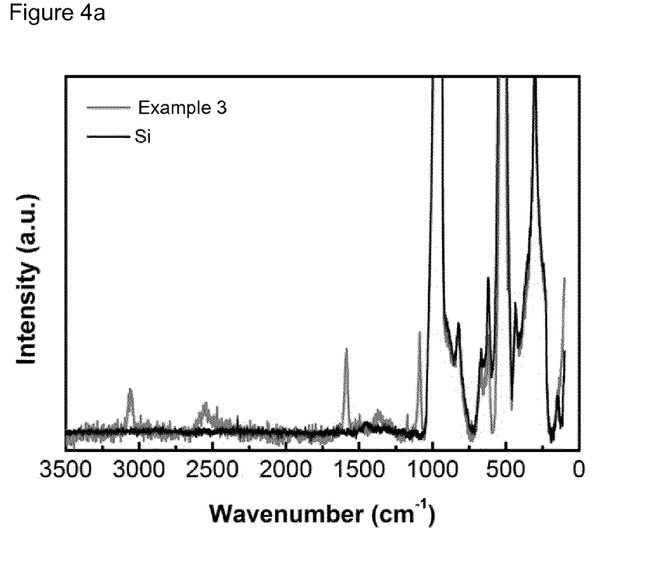
Figure 4B:
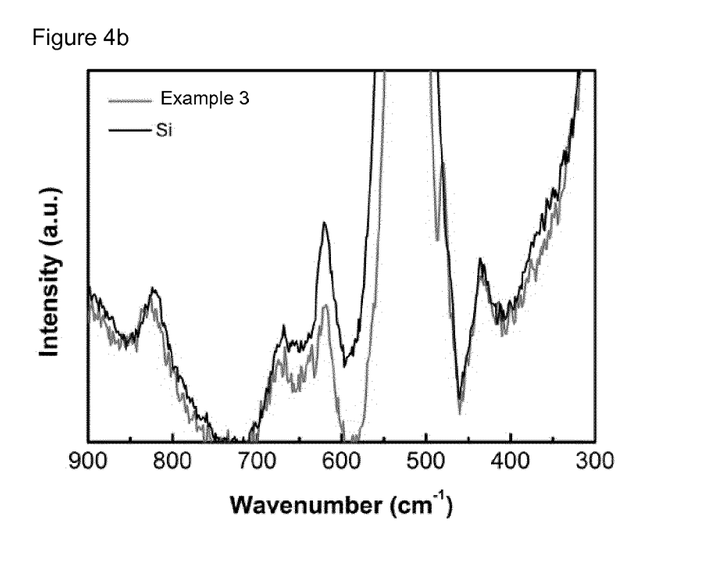

FIGS. 4a and 4b show the Raman absorption spectrum of this laminate prepared on a silicon wafer, wherein FIG. 4a shows the whole spectrum and FIG. 4b shows the spectrum from 900 to 300 cm$^{-1}$.

Example 4 (Inventive)

A barrier film was made as in example 1 wherein a sequence [[TMA-H$_2$O]$_{25}$-TMA-4MP] was consecutively performed 90 times.

Figure 5:
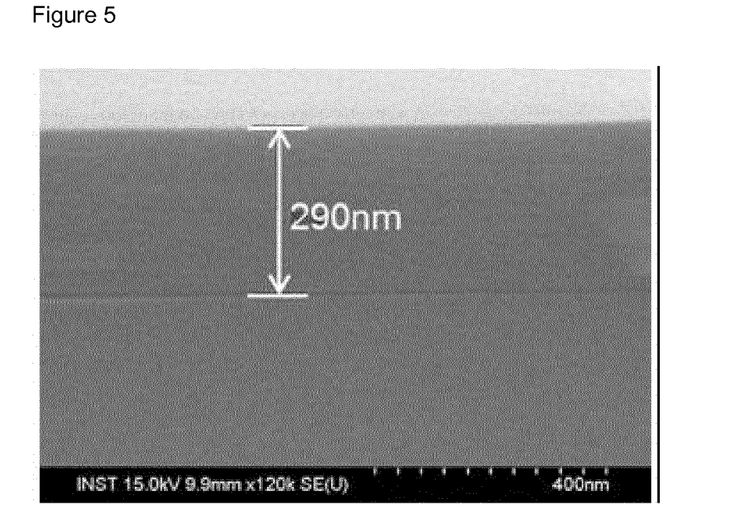

The same laminate was prepared on a silicon wafer. This wafer was fractured and subject to scanning electron microscopy. The thus obtained image is depicted in FIG. 5. The thickness of the laminate was estimated from the image to be 290 nm.

Example 5 (Comparative)

A barrier film was made as in example 1 wherein a sequence [[TMA-H$_2$O]$_3$-TMA-4MP] was consecutively performed 380 times.

Figure 6:
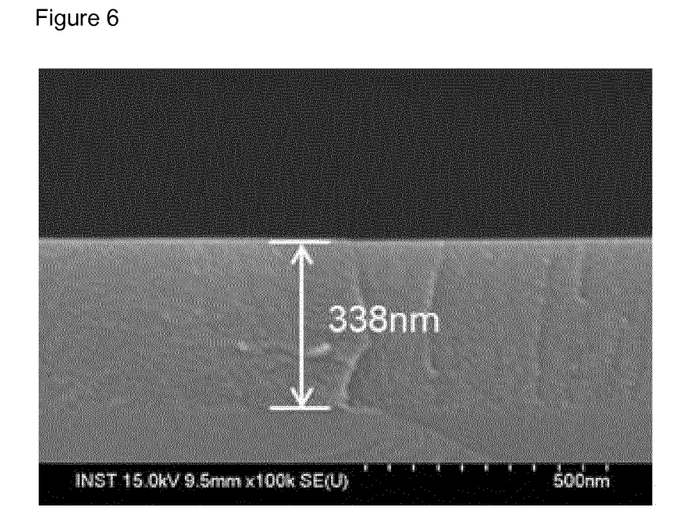

The same laminate was prepared on a silicon wafer. This wafer was fractured and subject to scanning electron microscopy. The thus obtained image is depicted in FIG. 6. The thickness of the laminate was estimated from the image to be 338 nm.

Example 6 (Comparative)

A barrier film was made by alternatingly exposing a PET substrate to TMA and H$_2$O under the conditions described in example 1 for 500 times.

Example 7 (Comparative)

A barrier film was made by alternatingly exposing a PET substrate to TMA and H$_2$O under the conditions described in example 1 for 250 times.

Example 8 (Inventive)

A barrier film was made as in example 2 wherein instead of 4MP 4-mercaptobenzylic alcohol (4MBA) was used which was kept at 90° C.

Example 9 (Inventive)

A barrier film was made as in example 3 wherein instead of 4MP 4MBA was used which was kept at 90° C.

Testing of the Barrier Films

The water vapor transmission rates (WVTR) of the barrier films prepared on PET substrates were tested by evaporating 144 dots of Ca with a thickness of 350 nm and a size of 10×10 µm$^2$ on each film at 1.3·10$^{-7}$ mbar. On top of the Ca dots another laminate was made as described in the respective examples. The films were then placed inside a drying cabinet with 70% relative humidity at 70° C. for 480 h. The WVTR was calculated by the number of Ca dots which became transparent after this storage procedure as described above.

The barrier film was bent 100 times at a bending radius of 0.5 and 1.5 cm respectively. Afterwards the WVTR was calculated as described above with the difference that the samples were stored for 360 h. The results are summarized in the following table.

| | WVTR in g/m$^2$d | | |
|---|---|---|---|
| | before | After bending with radius of | |
| Example | bending | 1.5 cm | 0.5 cm |
| 1 (inventive) | 6 · 10$^{-5}$ | | |
| 2.1 (inventive) | 2 · 10$^{-6}$ | | |
| 2.2 (inventive) | <1 · 10$^{-6}$ | <2 · 10$^{-6}$ | <3 · 10$^{-6}$ |
| 2.3 (inventive) | <1 · 10$^{-6}$ | | |
| 3 (inventive) | <1 · 10$^{-6}$ | 2 · 10$^{-6}$ | 7 · 10$^{-5}$ |
| 4 (inventive) | <1 · 10$^{-6}$ | | |
| 5 (comparative) | >0.1 | | |
| 6 (comparative) | 1 · 10$^{-6}$ | >0.1 | >0.1 |
| 7 (comparative) | 5 · 10$^{-5}$ | >0.1 | >0.1 |
| 8 (inventive) | <1 · 10$^{-6}$ | <1 · 10$^{-6}$ | <1 · 10$^{-6}$ |
| 9 (inventive) | <1 · 10$^{-6}$ | <1 · 10$^{-6}$ | <1 · 10$^{-6}$ |

In addition, the film obtained in example 8 was bent 1000 times at a bending radius of 0.5 and 1.5 cm respectively. The WVTR remained under 1·10$^{-6}$ g/m$^2$d.

The invention claimed is:

1. A laminate comprising, more than once, a sequence comprising
    (a) an inorganic layer of a (semi)metal oxide, elemental (semi)metal or (semi)metal nitride having a thickness of 0.4 to 3 nm and
    (b) an organic layer consisting of S and one or more elements selected from the group consisting of C, H, O, N, Se and P,
    wherein the laminate has a water vapor transmission rate (WVTR) of less than 10$^{-2}$ g/m$^2$d when dried at 70% relative humidity at 70° C. for 480 h and bent with a radius of 1.5 cm.

2. The laminate according to claim 1 wherein the sulfur of the organic layer is in an oxidation state −2, −1 or 0.

3. The laminate according to claim 1,
    wherein the inorganic layer comprises AlO$_x$(OH)$_y$,
    wherein 0≤x≤1.5;
    0≤y≤3 and
    2x+y=3.

4. The laminate according to claim 1, comprising at least 30 of the inorganic layers (a) alternating with at least 30 of the organic layers (b).

5. A barrier film comprising the laminate according to claim 1.

6. The barrier film according to claim 5 wherein the barrier film further comprises a polymeric substrate.

7. The barrier film according to claim 5 wherein the barrier film further comprises a planarization layer.

8. A method of encapsulating, packaging, or passivating an object, the method comprising:
    encapsulating, packaging, or passivating the object with the barrier film according to claim 5.

9. An electronic device comprising the barrier film according to claim 5.

10. The barrier film according to claim 5, which has a WVTR of less than 10$^{-5}$ g/m$^2$d when dried at 70% relative humidity at 70° C. for 480 h.

11. The barrier film according to claim 5, which has a WVTR of less than 10$^{-2}$ g/m$^2$d when dried at 70% relative humidity at 70° C. for 480 h and bent with a radius of 1.5 cm.

12. The barrier film according to claim 5, which, when dried at 70% relative humidity at 70°C for 480 h and bent with a radius of 1.5 cm, has a WVTR that is not more than 1000 times higher than a WVTR of the barrier film when dried at 70% relative humidity at 70° C. for 480 h and not bent.

13. A process for producing the laminate according to claim 1, the process comprising, more than once, a sequence comprising:
(a) depositing an inorganic layer of a (semi)metal oxide, elemental (semi)metal or semi(metal) nitride by performing 4 to 150 cycles of an atomic layer deposition (ALD) process, and
(b) depositing an organic layer consisting of S and one or more elements selected from the group consisting of C, H, O, N, Se and P by a molecular layer deposition process,
wherein the ALD process comprises the decomposition of a (semi)metal compound to the (semi)metal oxide, elemental (semi)metal or (semi)metal nitride after the (semi)metal compound has been deposited.

14. The process according to claim 13, wherein the molecular layer deposition process comprises depositing the organic layer with a thiol.

15. The process according to claim 13, wherein the molecular layer deposition process comprises depositing the organic layer with a dithiol.

16. The process according to claim 13, wherein the molecular layer deposition process comprises depositing the organic layer with an aromatic thiol.

17. The process according to claim 13, wherein the atomic layer deposition process comprises depositing the inorganic layer with an Al-containing compound.

18. The process according to claim 13, wherein the process comprises performing the sequence comprising (a) and (b) at least 30 times.

19. A laminate comprising, more than once, a sequence comprising:
(a) an inorganic layer of a (semi)metal oxide, elemental (semi)metal or (semi)metal nitride having a thickness of 0.4 to 3 nm and
(b) an organic layer consisting of S and one or more elements selected from the group consisting of C, H, O, N, Se and P obtained with an organic thiol comprising one or more hydroxyl groups.

20. The laminate according to claim 19, wherein the laminate has a water vapor transmission rate (WVTR) of less than $10^{-2}$ g/m$^2$d when dried at 70% relative humidity at 70° C. for 480 h and bent with a radius of 1.5 cm.

* * * * *